United States Patent Office 3,143,423

Patented Aug. 4, 1964

3,143,423
NEW PHOTO-RESIST BENZOYLAZIDE COMPOSITIONS

George A. Reynolds, James A. Van Allan, and Douglas G. Borden, all of Rochester, N.Y., assignors to Eastman Kodak Company, Rochester, N.Y., a corporation of New Jersey No Drawing. Filed Apr. 2, 1962, Ser. No. 184,557
8 Claims. (Cl. 96—91)

This invention relates to photo-resist compositions and more particularly to photo-resist compositions containing light-sensitive benzoylazide compounds and the use of these compositions.

Various light-sensitive layers not containing silver halide compounds are well known in the art of making copies of documents, drawings, microfilm images, printed circuits, metal engraving, etc.

For example, various polymer layers, such as albumin, glue, and certain synthetic polymers, such as poly(vinyl alcohol), poly(vinyl cinnamate), etc., are used in making photo-resists for metal engraving, the preparation of lithographic plates, printed circuits, etc. Where necessary, these polymers have been sensitized by the addition of arylazides, for example, azidostyryl ketones, azidostyrylaryl azides, etc., so that exposure of layers formed from these materials alters their physical properties, such as solvent solubility, so that by development with the appropriate solvent a relief image is obtained for printing, for metal etching, etc.

New sensitizers that will photoinsolubilize a large variety of soluble non-light-sensitive polymeric binders are needed for producing new photo-resist compositions.

It is, therefore, an object of our invention to provide a new class of photo-resist compositions which are valuable for producing print-out images, relief images that can be dyed and used for lithographic printing, metal etching applications, etc.

Another object of our invention is to provide a novel photo-resist composition comprising a non-light-sensitive, soluble polymeric binder selected from a wide variety of these binders, a light-sensitive benzoylazide compound and a solvent.

A further object of our invention is to provide a photo-resist element coated with our composition in which the non-light-sensitive, soluble polymeric binder is insolubilized upon light exposure by the photolysis of a substituted benzoylazide and the subsequent copolymerization of the photolysis product to form a "cage-like" structure that entraps the binder rendering it insoluble.

Still further objects will become obvious from the following specification and claims.

These and other objects are accomplished according to our invention by making a film-forming photo-resist composition comprising a solvent, a non-light-sensitive, soluble polymeric binder and certain light-sensitive substituted benzoylazide compounds.

The photopolymerizable benzoylazide compounds used to advantage according to our invention include the compounds represented by the formula:

(I)

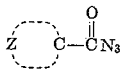

wherein Z represents the nonmetallic atoms required to complete a phenyl group substituted on the carbon in the third or fourth positions with a group with a reactive group capable of reacting with an isocyanate group on another molecule.

These benzoylazide compounds include those shown to advantage by the formula:

(II)

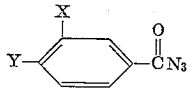

wherein X and Y each represent a hydrogen atom, a hydroxyl group, a carboxyl group, a mercapto group, an amino group, such as an unsubstituted amino group, an alkamino group (e.g., methylamino, ethylamino, propylamino, isopropylamino, butylamino, secondary butylamino, tertiarybutylamino, amylamino, hexylamino, benzylamino, 4-methylbenzylamino, etc.), an arylamino group (e.g., phenylamino, 4-methylphenylamino, 2-methylphenylamino, 4-ethylphenylamino, etc.), an arylmethylenimine group (e.g., phenylmethylenimine, 4-methylphenylmethylenimine, 2-ethylphenylmethylenimine, etc.), a hydroxyalkyl group (e.g., hydroxymethyl, hydroxyethyl, hydroxypropyl, etc.), the 2-hydroxyethoxy group, a carboxyalkyl group (e.g., carboxymethyl, carboxyethyl, carboxypropyl, etc.), a mercaptoalkyl group (e.g., mercaptomethyl, mercaptoethyl, etc.), an aminoalkyl group (e.g., aminoethyl, aminopropyl, etc.), a hydroxyaryl group (e.g., 4-hydroxyphenyl, 3-hydroxyphenyl, 2-hydroxyphenyl, etc.), a carboxyphenyl group (e.g., 4-carboxyphenyl, 3-carboxyphenyl, 2-carboxyphenyl, etc.), a mercaptoaryl group (e.g., 4-mercaptophenyl, 2-mercaptophenyl, etc.), an aminoaryl group (e.g., 4-aminophenyl, 3-aminophenyl, 2-aminophenyl, etc.), and an azido group, such that one of the groups X and Y represents a hydrogen atom.

These benzoyl azides are not to be confused with "aromatic azides." Such a comparison would be no more valid than drawing a similarity between chlorobenzene and benzoyl chloride or cinnamoyl chloride. The benzoylazides used in our photo-resist compositions characterize them from photo-resist compositions known before. Our composition is insolubilized in a novel way in which the soluble non-light-sensitive binder material is entrapped by a "cage-like" structure formed by the photolysis and subsequent copolymerization of the substituted benzoylazide molecules that are light exposed.

The following representative examples will serve to illustrate the light-sensitive aryl carbazido compounds that are used to advantage in our photo-resist compositions:

Compound 1

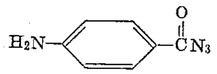

4-aminobenzoylazide

Compound 2

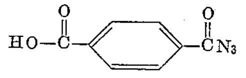

4-carboxybenzoylazide

Compound 3

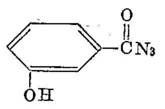

3-hydroxybenzoylazide

Compound 4

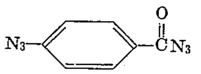

4-azidobenzoylazide

Compound 5

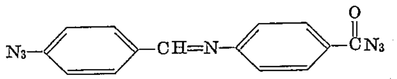

4-(4-azidophenylmethylenimine)benzoylazide

Compound 6

4-hydroxybenzoylazide

Compound 7

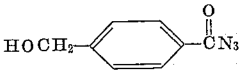

4-hydroxymethylbenzoylazide

Compound 8

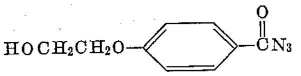

4-(2-hydroxyethoxy)benzoylazide

Compound 9

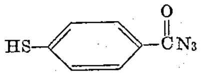

4-mercaptobenzozlazide

Compound 10

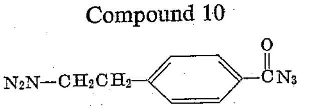

4-$\beta$-aminoethylbenzoylazide

A wide variety of non-light-sensitive soluble colloidal binders are used to advantage in our photo-resist materials. These include water-soluble, aqueous solvent-soluble and organic-solvent-soluble colloids.

The water-soluble colloids include gelatin, cellulose derivatives, such as, ethyl cellulose, cellulose acetate propionate, etc., polyvinyl compounds, such as poly(vinyl alcohol), poly(vinyl acetate), etc., polyethylene oxide, etc.

The aqueous solvent-soluble colloids include copolymers of ethyl acrylate and acrylic acid, copolymers of butadiene and methacrylic acid, etc., which are soluble in aqueous ammoniacal solutions.

The organic solvent-soluble colloids include polyvinyl compounds, such as, poly(vinyl butyral), poly(vinyl chloride), poly(4-vinyl pyridine), etc., polystyrene, polyvinylidene chloride acrylic acid derivatives, copolymers of ethyl acrylate and acrylic acid, copolymers of butadiene and methacrylic acid, copolymers of methyl acrylate and vinylidene chloride, terpolymers of acrylonitrile, vinylidene chloride and ethyl acrylate, etc., terpolymer of poly(vinyl chloride), vinyl acetate and maleic acid, copolymers of vinyl chloride-acetate, copolymers of styrene and butadiene, alcohol-soluble nylon (alcohol-soluble polyamide resins), natural rubber, poly-cis-1,4-isoprene, etc.

The film-forming light-sensitive compositions used to coat our photo-resist elements are prepared by mixing a solution of at least one of our light-sensitive benzoylazide compounds in a suitable solvent into a solution of at least one of the non-light-sensitive colloidal binders.

Solvents useful for dissolving our benzoylazide compounds include the lower alcohols, such as methanol, ethanol, isopropanol, etc., ketones, such as, cyclohexanone, 2-butanone, 4-methyl-2-pentanone, acetone, etc., pyridine, etc., and appropriate mixtures of these solvents.

Solvents used to advantage for dissolving our non-light-sensitive colloidal binders include water, aqueous solutions, such as, ammoniacal solutions, and any of the organic solvents commonly employed in the art for coating high polymer layers. Preferred organic solvents for this purpose include the lower alcohols and the ketones mentioned previously, dimethyl formamide and tetrahydrofuran, benzene, toluene, pyridine, etc.

The ratio of benzoylazide to colloidal binders can be varied over a wide range with the benzoylazide comprising from about 2% up to the percent at which the azide tends to crystallize out usually above 20% in terms of the dry mixtures of azide and binder.

Our film forming light-sensitive photo-resist compositions are coated on any of the support materials used conventionally for photo-resist elements. These support materials include various polymeric materials, such as polyester film base, cellulose acetate, cellulose acetate propionate, the polycarbonates, etc., baryta coated paper, metal sheeting such as copper, aluminum, silicated aluminum etc., metal sheeting laminated to a non-conducting base for circuit-boards, such as, copper on a resin base, copper bonded to a fiber-board base, etc., plastic sheeting coated with an evaporated metal film, etc.

These supports can be coated in any of the conventional ways well known in the photo-resist art. A particularly convenient method that is widely used is referred to as "whirl coating."

The following representative examples will still further illustrate our invention:

EXAMPLE 1

One gram of 4-aminobenzoylazide, our Compound 1, was dissolved in 20 ml. of isopropanol and 5 ml. of cyclohexanone and this solution was added to 25 ml. of a 10% dope of poly(vinyl butyral) in methanol. The mixture was whirl-coated on 5-mil aluminum and exposed through a photographic negative to a General Electric Co. sunlamp at 4 inches for one minute. The image was developed in methanol and dyed with alcoholic Crystal Violet. An excellent image resulted.

EXAMPLE 2

Three milliliters of a 10% solution of Compound 1 in cyclohexanone was diluted with 1 ml. of methanol and whirl-coated on silicated aluminum (no polymeric binder was used). A one-minute exposure through a photographic negative to a General Electric Co. sunlamp at 10 inches, followed by development for 2 minutes in methanol yielded a sharp image which dyed very well. A similar 3-minute exposure heated for 5 minutes at 80° C. stripped within 15 minutes when etched in a 40% sodium hydroxide solution at 40° C.

EXAMPLE 3

A solution of 0.2 g. of Compound 1 dissolved in 10 ml. of acetic acid was diluted with 10 ml. of water and coated on a baryta-coated paper. A 3 minute exposure through a photographic line negative to a sunlamp at 10 inches followed by development in pyridine and dying with Acid Cyanine N dye produced a violet image on a purple background. The image was mottled due to crystallization of Compound 1 after coating. Another coating was made of this composition to which 1 ml. of levulinic acid was added. A much sharper image was produced upon exposure and development due to the suppression of crystallization. A similar coating, developed in acetic acid and dyed in Acid Cyanine N dye gave a much more intense image. A similar coating, developed in methanol, gave a light-brown image on a white background.

A solution of 0.1 g. of Compound 1 dissolved in 5 ml. of acetic acid and 5 ml. of water was added to 10 ml. of 10% gelatin at 40° C. and coated on a polyester film base. Exposure as described previously, followed by development in warm water and dying in Acid Green dye produced a very sharp green relief image on a transparent base.

A solution of 0.2 g. of Compound 1 dissolved in 10 ml. of pyridine and diluted with 10 ml. of water was coated on a polyester film base, exposed as described, developed in dilute acetic acid and dyed with Acid Cyanine N dye produced a weak violet image. A similar coating, developed in methanol gave a light yellow-brown image before dyeing.

A solution of 0.1 g. of Compound 1 in 5 ml. of pyridine and 5 ml. of water was added to 20 ml. of a 15% solution of the ammonium salt of a copolymer of ethyl acrylate and acrylic acid (20:80 available commercially) in water and isopropanol and whirl-coated on a polyester film base. After exposure as described previously, it was developed in methanol and dyed with alcoholic Crystal Violet dye to give an intense blue image on a transparent background.

EXAMPLE 4

Seven ml. of a stock solution of 1.5 g. of Compound 1 in 16 ml. of methoxyethanol was added to a 5% solution of a copolymer of ethyl acrylate and acrylic acid (20:80) in methanol and whirl-coated on 5-mil copper. Exposures for 2 minutes through a photographic line negative to a sunlamp produced a faint yellowish print-out image. Development in methanol brought up a good image which resisted 25 minutes etching in 36° Baumé ferric chloride at 40° C. The remaining resist was then easily stripped by washing in dilute aqueous ammonia.

EXAMPLE 5

A solution of 0.3 g. of Compound 1 dissolved in 9 ml. of cyclohexanone and 3 ml. of isopropanol was added to 4 ml. of a 10% solution of poly(vinyl butyral) in methanol and whirl-coated on 5 mil copper, prepared by pumicing and washing with dilute acid. This composition was also whirl-coated on a circuit-board (a 1.5 mil copper on a resin base), exposed through a photographic negative for 3 minutes to a sunlamp at 4 inches and developed in methanol for two minutes. The samples were then dried at 85° C. for 5 minutes and etched in a ferric chloride solution at 40° C. for 30 minutes. On the circuit-board, a good printed circuit resulted. The copper was etched over 2 mils in depth with no stripping or undercutting of the resist.

Similarily a solution of 3.0 g. of Compound 1 in 100 ml. of cyclohexanone was prepared and 10 ml. of this was added to each of the following polymer solutions:

(A) 8 ml. of cyclohexanone containing 0.4 g. of a methyl acrylate-vinylidene chloride copolymer;
(B) 8 ml. of cyclohexanone containing 0.4 g. of a terpolymer of acrylonitrile, vinylidene chloride and ethyl acrylate,
(C) 4 ml. of a 10% solution of poly(vinyl acetate) in methanol; and
(D) 4 ml. of a 10% solution of poly(vinyl butyral) in methanol.

Each of these compositions was whirl-coated on a 5 mil copper sheet and exposed for one minute through a photographic line negative to a sunlamp at four inches. The photo-resists prepared from both (A) and (B) produced excellent images when developed in trichloroethylene and they withstood 20 minutes of etching in 36° Baumé ferric chloride at 40° C. (C) produced an excellent image when developed in methanol or in trichloroethylene. This image withstood the etching treatment given (A) and (B) very well. (D) produced an excellent image after development in either methanol or in 2-butanone. Its resistance to etching was excellent just as (A), (B) and (C).

EXAMPLE 6

A solution of 0.3 g. of 4-carboxybenzoylazide, Compound 2, in 10 ml. of cyclohexanone and 4 ml. of isopropanol was added to 4 ml. of a 5% solution of a 20:80 copolymer of ethyl acrylate and acrylic acid in methanol and whirl-coated on 5 mil copper. Exposure for 3 minutes through a photographic line negative to a sunlamp at four inches produced a fair image after development in methanol. This image readily accepted dye in an alcoholic Crystal Violet dye bath. This image had good etch resistance in a 43° Baumé ferric chloride solution.

EXAMPLE 7

A solution of 0.5 g. of 4-(4-azidophenylmethylenimine) benzoylazide, Compound 5, in 7 ml. of cyclohexanone and 3 ml. of isopropanol was added to 2.0 g. of a 10% solution of poly(vinyl butyral) in methanol and whirl-coated on a silicated aluminum sheet. Exposure for 4 minutes through a photographic line negative to a sunlamp at 4 inches gave a print-out image which was further developed in methanol.

Similarly the other benzoylazide compounds of our invention can be used to advantage in photoresist compositions according to our invention.

Our invention is still further illustrated by a description of the preparation of representative benzoylazide compounds.

*Compound 1*

To a solution of 19 g. of aniline in 50 ml. of concentrated hydrochloric acid and 200 g. of ice, was added 14 g. of sodium nitrite dissolved in 40 ml. of water. After stirring for 0.5 hour, the excess nitrous acid was destroyed with sulfamic acid. A solution of 30 g. of p-aminobenzhydrazide in dilute hydrochloric acid was cooled to 10° and added slowly with stirring to the above diazonium solution. After stirring for one hour in the cold, the mixture was neutralized with sodium acetate and the pale yellow solid was collected and washed with water to yield 29 g. of product that explodes at 123° and forms a solid that melts above 300°.

*Compound 2*

A mixture of 168 g. of the half isobutyl ester of terephthalic acid and 350 ml. of hydrazine hydrate was refluxed overnight. The reaction mixture was evaporated to dryness in vacuo and dried. This crude material was dissolved in 32 g. of sodium hydroxide in 1.5 liters of water, a little insoluble material was filtered off, 110 g. of sodium nitrite was dissolved in the solution, and the resulting mixture was added slowly with good stirring to 200 ml. of concentrated hydrochloric acid plus 500 g. of ice. The white solid was collected, dissolved in 2 liters of acetone, some insoluble material filtered off, and the product precipitated by addition to 3 liters of water. After distilling, the white solid was collected and dried, yielding 130 g. of product which explodes at about 112° C. to give a solid melting about 300° C.

*Compound 3*

Ten g. of m-hydroxybenzoic acid hydrazide was dissolved in 75 ml. of water containing 5.5 ml. of concentrated hydrochloric acid. This solution was cooled to 5° by addition of Dry Ice. A solution of 4.6 g. of sodium nitrite in 25 ml. of water was added with the temperature below 10°. The mixture was stirred for two hours, filtered, washed with water, and dried. Yield, 9 g.; M.P. 93°.

*Compound 4*

Three g. of 4-aminobenzoic acid hydrazide was dissolved in 6 ml. of concentrated hydrochloric acid and cooled in an ice-acetone bath to about 0° C. 2.8 g. of sodium nitrite in water was added. The reaction mass was stirred for 3 minutes and 1.3 g. of sodium azide was added. The reaction mass was stirred until it warmed up to room temperature. The solid reaction product was collected on a filter and washed with water. The solid product was then dissolved in acetone, diluted with water and cooled in a refrigerator. The cream-colored crystalline material formed was collected on a filter and dried. M.P. 57° C.

*Compound 5*

This compound is prepared by condensing 4-aminobenzoylazide with 4-azidobenzaldehyde.

*Compound 6*

This compound was made in essentially the same manner as Compound 3 but starting with p-hydroxycarbohydrazidobenzene. M.P. 126°.

*Compound 7*

This compound is prepared from methyl 4-(2-hydroxymethyl) benzoate in a manner similar to that described for Compound 8.

*Compound 8*

A mixture of 10 g. of methyl 4-(2-hydroxyethoxy)-benzoate (Frdl., 15, 1724), 5 ml. of hydrazine and 100 ml. of ethanol is refluxed five hours, evaporated to a small volume, chilled, and the solid hydrazide collected. To a solution of 5 g. of the hydrazide in 50 ml. of ice water and 5 ml. of concentrated hydrochloric acid is added 2 g. of sodium nitrite dissolved in 10 ml. of water. After stirring for 30 minutes, the solid (Compound 8) is collected, washed with a little water, and recrystallized from aqueous acetone.

*Compound 9*

The hydrazide is made by refluxing 0.1 mole of methyl-4-mercaptobenzoate in 70 ml. of 64 percent hydrazine for five hours. The mixture is poured into water acidified to pH 6.1, filtered, and crystallized from water. The azide is made by the same procedure as used for Compound 3.

*Compound 10*

A mixture of 7 g. of ethyl 4-(2-aminoethyl)benzoate and 25 ml. of hydrazine hydrate is refluxed overnight. The solution is chilled and the solid 4-(2-aminoethyl)-benzhydrazide collected.

A solution of 6.3 g. of p-anisidine in 12 g. of sulfuric acid and 100 ml. of ice water is treated with 3.5 g. of sodium nitrite. This diazonium solution is added to a solution of 8.9 g. of the above hydrazide in cold dilute hydrochloric acid. After stirring for one-half hour, the mixture is neutralized with sodium acetate and the solid collected and washed with water and then dried. The product, Compound 10, is purified by recrystallization from a mixture of acetone and water.

Other photopolymerizable benzoylazide compounds of our invention are prepared by methods similar to those described herein.

Our film-forming light-sensitive photo-resist compositions are valuable for producing print-out images, relief images that are dyed and used for lithographic printing, metal etching applications, etc. A wide variety of non-light-sensitive soluble colloid binders are used to advantage in making our photo-resist compositions. These compositions are made light sensitive by photopolymerizable benzoylazide compounds which have a group substituted on the carbon atom in the third or fourth position on the phenyl ring that has a reactive hydrogen atom. It is believed that upon photolysis the residue of the benzoylazide molecules react to form a "cage-like" structure that entraps the binder material so that it is not removed by the action of the solvent used in the development process.

The invention has been described in detail with particular reference to preferred embodiments thereof but it will be understood that variations and modifications can be effected within the spirit and scope of the invention as described hereinabove and as defined in the appended claims.

We claim:

1. A light-sensitive photo-resist element comprising:

(1) a support coated with (2) a layer comprising (*a*) a light-sensitive photopolymerizable benzoylazide selected from the class having the formula:

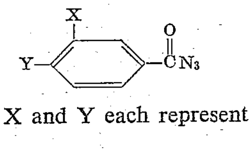

wherein X and Y each represent a member selected from the class consisting of the hydrogen atom, the hydroxyl group, the carboxyl group, the thiol group, an amino group, an arylmethylenimine group, a hydroxyalkyl group, the 2-hydroxyethoxy group, a carboxyalkyl group, a thiolalkyl group, an aminoalkyl group, a hydroxyaryl group, a carboxyphenyl group, a mercaptoaryl group, an aminoaryl group, and the azido group, such that said amino group, said aminoalkyl group and said aminoaryl group each contain at least one active hydrogen atom attached to the nitrogen atom and such that one of the groups X and Y represents the hydrogen atom, and (*b*) at least one colloidal binder selected from the class consisting of gelatin; ethyl cellulose; cellulose acetate propionate; poly(vinyl acetate); poly(vinyl butyral); poly(4-vinyl pyridine); polyethylene oxide; polystyrene; copolymers of ethyl acrylate and acrylic acid; copolymers of butadiene and methacrylic acid; copolymers of styrene and butadiene; natural rubber; poly-cis-1,4-isoprene; homopolymers of vinyl chloride; copolymers of vinyl alcohol and vinyl acetate; copolymers of vinyl chloride and vinyl acetate; copolymers of methyl acrylate and vinylidene chloride; terpolymers of acrylonitrile, ethylacrylate and vinylidene chloride; terpolymers of poly(vinyl chloride), vinyl acetate and maleic acid; and an alcohol soluble polyamide resin.

2. A light-sensitive photo-resist element of claim 1 in which the benzoylazide is 4-aminobenzoylazide.

3. A light-sensitive photo-resist element of claim 1 in which the benzoylazide is 4-carboxybenzoylazide.

4. A light-sensitive photo-resist element of claim 1 in which the benzoylazide is 4-(4-azidophenylmethylenimine)benzoylazide.

5. A film-forming light-sensitive photo-resist composition comprising a solution of:

(1) at least one solvent-soluble light-sensitive photopolymerizable benzoylazide selected from the class having the formula:

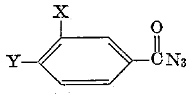

wherein X and Y each represent a member selected from the class consisting of the hydrogen atom, the hydroxyl group, the carboxyl group, the thiol group, an amino group, an arylmethylenimine group, a hydroxyalkyl group, the 2-hydroxyethoxy group, a carboxyalkyl group, a thiolalkyl group, an aminoalkyl group, a hydroxyaryl group, a carboxyphenyl group, a mercaptoaryl group, an aminoaryl group, and the azido group, such that said amino group, said aminoalkyl group and said aminoaryl group each contain at least one active hydrogen atom attached to the nitrogen atom, and such that one of the groups X and Y represents the hydrogen atom; and (2) at least one colloidal binder selected from the class consisting of gelatin; ethyl cellulose; cellulose acetate propionate; poly(vinyl acetate); poly(vinyl butyral); poly(4-vinyl pyridine); polyethylene oxide; polystyrene; copolymers of ethyl acrylate and acrylic acid; copolymers of butadiene and methacrylic acid; copolymers of styrene and butadiene; natural rubber; poly-cis-1,4-isoprene; homopolymers of vinyl chloride; copolymers of vinyl alcohol and vinyl acetate; copolymers of vinyl chloride and vinyl acetate; copolymers of methyl acrylate and vinylidene chloride; terpolymers of acrylonitrile, ethylacrylate and vinylidene chloride; terpolymers of poly(vinyl chloride), vinyl acetate and maleic acid; and an alcohol soluble polyamide resin.

6. A film-forming light-sensitive photo-resist composition of claim 5 in which the benzoylazide is 4-aminobenzoylazide.

7. A film-forming light-sensitive photo-resist composition of claim 5 in which the benzoylazide is 4-carboxybenzoylazide.

8. A film-forming light-sensitive photo-resist composition of claim 5 in which the benzoylazide is 4-(4-azidophenylmethylenimine)benzoylazide.

References Cited in the file of this patent

UNITED STATES PATENTS

| | | |
|---|---|---|
| 2,449,980 | Damschroder et al. | Sept. 28, 1948 |
| 2,695,846 | Mally | Nov. 30, 1954 |
| 2,789,052 | Elliott | Apr. 16, 1957 |
| 2,852,379 | Hepher et al. | Sept. 15, 1958 |
| 3,062,650 | Sagura et al. | Nov. 5, 1962 |
| 3,092,494 | Sus et al. | June 4, 1963 |